(12) United States Patent
Kikuchi et al.

(10) Patent No.: US 10,886,176 B2
(45) Date of Patent: Jan. 5, 2021

(54) SELF-ALIGNED INTERCONNECT PATTERNING FOR BACK-END-OF-LINE (BEOL) STRUCTURES INCLUDING SELF-ALIGNED VIA THROUGH THE UNDERLYING INTERLEVEL METAL LAYER

(71) Applicant: Tokyo Electron Limited, Tokyo (JP)

(72) Inventors: Yuki Kikuchi, Albany, NY (US); Kaoru Maekawa, Albany, NY (US)

(73) Assignee: Tokyo Electron Limited, Tokyo (JP)

( * ) Notice: Subject to any disclaimer, the term of this patent is extended or adjusted under 35 U.S.C. 154(b) by 7 days.

(21) Appl. No.: 16/374,239

(22) Filed: Apr. 3, 2019

(65) Prior Publication Data

US 2019/0304836 A1 Oct. 3, 2019

Related U.S. Application Data

(60) Provisional application No. 62/651,938, filed on Apr. 3, 2018.

(51) Int. Cl.
*H01L 21/768* (2006.01)

(52) U.S. Cl.
CPC .... *H01L 21/76897* (2013.01); *H01L 21/7682* (2013.01); *H01L 21/76805* (2013.01); *H01L 21/76816* (2013.01); *H01L 21/76834* (2013.01); *H01L 21/76885* (2013.01); *H01L 21/76831* (2013.01); *H01L 21/76843* (2013.01); *H01L 21/76871* (2013.01); *H01L 21/76883* (2013.01)

(58) Field of Classification Search
CPC .......... H01L 21/7682; H01L 21/76885; H01L 21/76805; H01L 21/76816; H01L 21/76831; H01L 21/76843; H01L 21/76871; H01L 21/76883; H01L 21/76897

See application file for complete search history.

(56) References Cited

U.S. PATENT DOCUMENTS

| | | |
|---|---|---|
| 2010/0301489 A1 | 12/2010 | Seidel et al. |
| 2015/0084196 A1 | 3/2015 | Riess et al. |
| 2015/0206836 A1 | 7/2015 | Bian |
| 2016/0197011 A1 | 7/2016 | Bristol et al. |
| 2016/0204002 A1 | 7/2016 | Wallace et al. |
| 2017/0256451 A1 | 9/2017 | Boemmels et al. |
| 2018/0033691 A1 | 2/2018 | You et al. |
| 2018/0114752 A1* | 4/2018 | Briggs .............. H01L 21/76805 |

OTHER PUBLICATIONS

Korean Intellectual Property Office, International Search Report and Written Opinion for International Application No. PCT/US2019/025583, dated Jul. 19, 2019, 10pp.

* cited by examiner

*Primary Examiner* — Ermias T Woldegeorgis

(57) ABSTRACT

Self-aligned interconnect patterning for back-end-of-line (BEOL) structures is described. A method of fabricating an interconnect structure for an integrated circuit includes depositing a first metal layer on an initial interconnect structure, forming a patterned spacer layer containing recessed features on the first metal layer, and etching a self-aligned via in the first metal layer and into the initial interconnect structure using a recessed feature in the patterned spacer layer as a mask. The method further includes filling the via in the first metal layer and the recessed features in the patterned spacer layer with a second metal layer, removing the patterned spacer layer, and etching a recessed feature in the first metal layer using the second metal layer as a mask.

20 Claims, 9 Drawing Sheets

SELF-ALIGNED INTERCONNECT PATTERNING FOR BACK-END-OF-LINE (BEOL) STRUCTURES INCLUDING SELF-ALIGNED VIA THROUGH THE UNDERLYING INTERLEVEL METAL LAYER

CROSS-REFERENCE TO RELATED APPLICATIONS

This application is related to and claims priority to U.S. Provisional Patent Application Ser. No. 62/651,938 filed on Apr. 3, 2018, the entire contents of which are herein incorporated by reference.

FIELD OF THE INVENTION

Embodiments of the invention are in the field of semiconductor structures and semiconductor processing and, in particular, in the field of self-aligned interconnect patterning for back-end-of-line (BEOL) structures.

BACKGROUND OF THE INVENTION

The scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory or logic devices on a chip, lending to the fabrication of products with increased capacity. The drive for ever-more capacity, however, is not without issue. The necessity to optimize the performance of each device becomes increasingly significant.

Integrated circuits commonly include electrically conductive microelectronic structures, which are known in the arts as vias, to electrically connect metal lines or other interconnects above the vias to metal lines or other interconnects below the vias. Vias are typically formed by a lithographic process. Representatively, a photoresist layer may be spin coated over a dielectric layer, the photoresist layer may be exposed to patterned actinic radiation through a patterned mask, and then the exposed layer may be developed in order to form an opening in the photoresist layer. Next, an opening for the via may be etched in the dielectric layer by using the opening in the photoresist layer as an etch mask. This opening is referred to as a via opening. Finally, the via may be filled with one or more metals or other conductive materials.

In the past, the sizes and the spacing of vias has progressively decreased, and it is expected that in the future the sizes and the spacing of the vias will continue to progressively decrease, for at least some types of integrated circuits (e.g., advanced microprocessors, chipset components, graphics chips, etc.). One challenge is that the overlay between the vias and the overlying interconnects, and the overlay between the vias and the underlying landing interconnects, generally need to be controlled to high tolerances on the order of a quarter of the via pitch. As via pitches scale ever smaller over time, the overlay tolerances tend to scale with them at an even greater rate than lithographic equipment is able to keep up.

A further challenge is that the extremely small via pitches generally tend to be below the resolution capabilities of even extreme ultraviolet (EUV) lithographic scanners. As a result, commonly two, three, or more different lithographic masks may be used, which tend to increase the costs. At some point, if pitches continue to decrease, it may not be possible, even with multiple masks, to print via openings for these extremely small pitches using EUV scanners.

SUMMARY OF THE INVENTION

Self-aligned interconnect patterning for back-end-of-line (BEOL) structures is disclosed in various embodiments. In one embodiment, a method of fabricating an interconnect structure for an integrated circuit includes depositing a first metal layer on an initial interconnect structure, forming a patterned spacer layer containing recessed features on the first metal layer, and etching a self-aligned via in the first metal layer and into the initial interconnect structure using a recessed feature in the patterned spacer layer as a mask. The method further includes filling the via in the first metal layer and the recessed features in the patterned spacer layer with a second metal layer, removing the patterned spacer layer, and etching a recessed feature in the first metal layer using the second metal layer as a mask.

BRIEF DESCRIPTION OF THE DRAWINGS

The accompanying drawings, which are incorporated in and constitute a part of this specification, illustrate embodiments of the invention and, together with a general description of the invention given above, and the detailed description given below, serve to explain the invention.

DETAILED DESCRIPTION OF SEVERAL EMBODIMENTS

Subtractive self-aligned via and trench patterning for BEOL interconnects is described in various embodiments. The subtractive method provides an alternative to common dual damascene processing schemes and avoids plasma etch damage to inter layer dielectric (ILD) materials. In the following description, well-known features, such as integrated circuit design layouts, are not described in detail in order to not unnecessarily obscure embodiments of the present invention. Furthermore, it is to be understood that the various embodiments shown in the Figures are illustrative representations and are not necessarily drawn to scale.

One or more embodiments are directed to an approach that employs a subtractive technique to form conductive vias and interconnects. Vias, by definition, are used to land on a previous layer metal pattern. In this vein, embodiments described herein enable a more robust interconnect fabrication scheme since alignment by lithography equipment is no longer relied on. Such an interconnect fabrication scheme can be used to save numerous alignment/exposures, and can be used to improve electrical contact yield by self-align technology.

Self-aligned contact and via patterning may be used for patterning multiple contacts or vias from a single lithographic feature. It makes use of the intersection of an enlarged feature resist mask and underlying trenches which are surrounded by a pre-patterned hard mask layer. This technique can, for example, be used in DRAM cells and also for advanced logic to avoid multiple exposures of pitch-splitting contacts and vias.

Figure 1B:
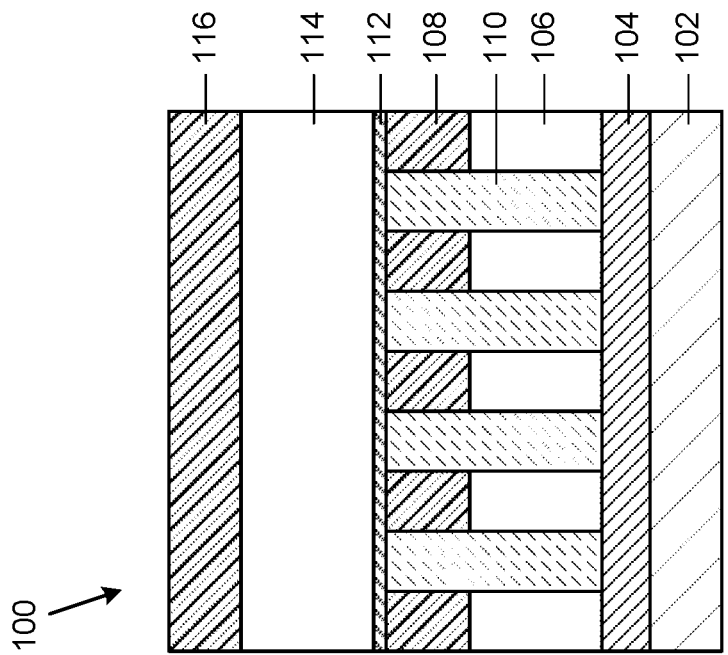
FIGS. 1A-1O illustrate portions of integrated circuit layers representing various operations in a method of subtractive self-aligned interconnect formation, in accordance with an embodiment of the present invention.
Figure 1A:
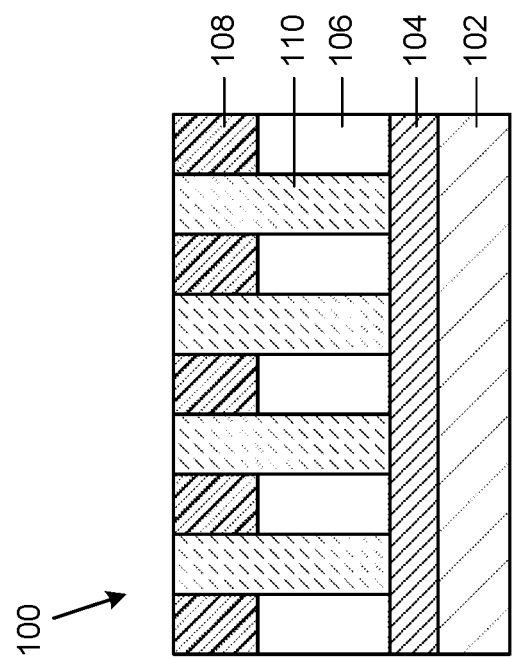

FIGS. 1A-1O illustrate portions of integrated circuit layers representing various operations in a method of subtractive self-aligned interconnect formation, in accordance with an embodiment of the present invention.

FIG. 1A illustrates a substrate 100 comprising an initial interconnect structure for a self-aligned interconnect formation following a deep via metal line fabrication, in accordance with an embodiment of the present invention. The substrate 100 includes a bottom layer 102, an etch stop layer (ESL) 104, inter layer dielectric (ILD) features 110, and metal lines 106 and dielectric hard mask (HM) lines 108 between the ILD features 110.

In an embodiment, ILD material, such as the material of the ILD features 110, is composed of or includes a layer of a dielectric or insulating material. Examples of suitable dielectric materials include, but are not limited to, oxides of silicon (e.g., silicon dioxide ($SiO_2$)), fluorinated oxides of silicon, carbon doped oxides of silicon, various low-k dielectric materials known in the arts, and combinations thereof. The ILD material may be formed by conventional techniques, such as, for example, chemical vapor deposition (CVD), physical vapor deposition (PVD), or by other deposition methods.

In an embodiment, as is also used throughout the present description, interconnect material, such as the material of metal lines 106, is composed of one or more metal or other conductive structures. A common example is the use of copper lines and structures that may or may not include barrier layers between the copper and surrounding ILD material. The metal interconnect lines may include barrier layers, stacks of different metals or alloys, etc. According to some embodiments, the metal lines 106 may contain or consist of ruthenium (Ru) metal, cobalt (Co) metal, or copper (Cu) metal.

FIG. 1B illustrates the structure of FIG. 1A following deposition of an ESL 112, a first metal layer 114, and a dielectric hard mask (HM) layer 116. In one example, the dielectric HM lines 108 and the dielectric HM layer 116 may comprise the same material. According to some embodiments, the first metal layer 114 may contain or consist of Ru metal, Co metal, or Cu metal.

Figure 1D:
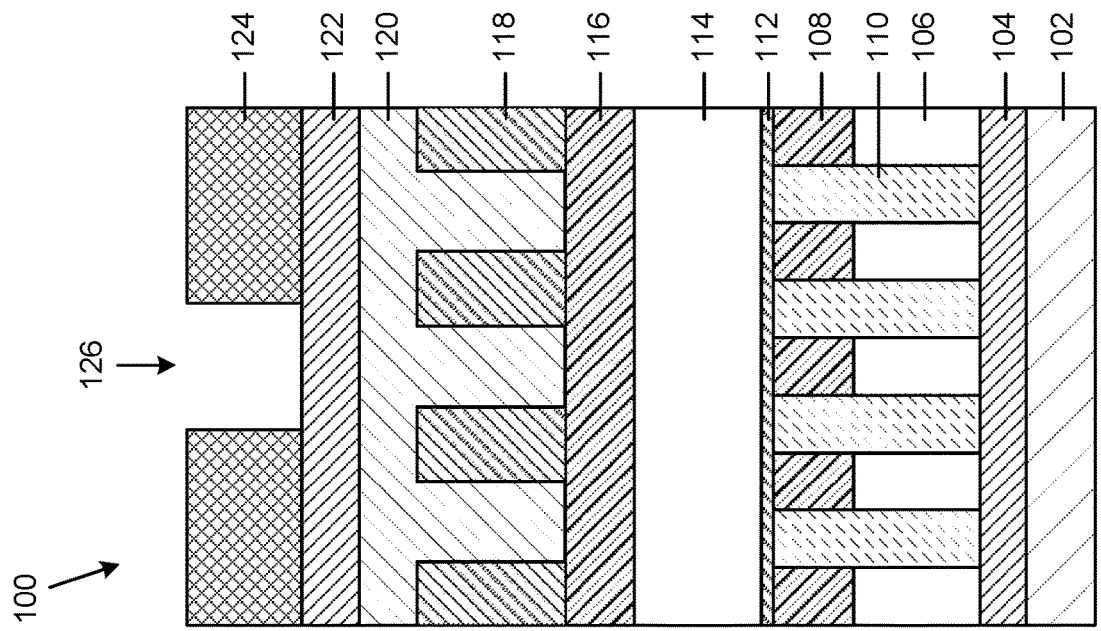
Figure 1C:
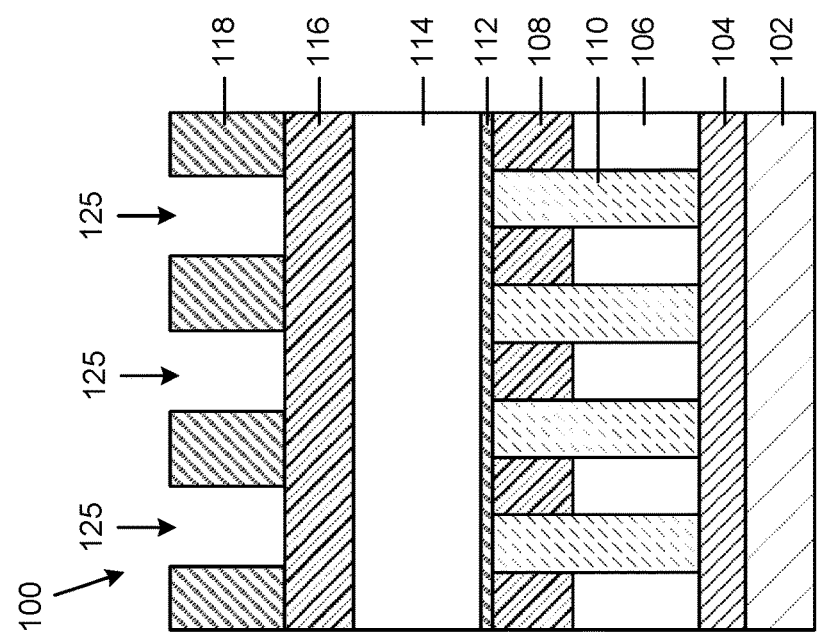

FIG. 1C shows a patterned spacer layer 118 containing recessed features 125 that is formed on the dielectric HM layer 116. For example, a pattern based on conventional lithography may first be formed, but the pitch may then be halved by the use of spacer mask patterning, as is known in the art. Even further, the original pitch may be quartered by a second round of spacer mask patterning. Thus, the patterned spacer layer 118 may be formed by self-aligned multiple patterning (SAMP), for example self-aligned double patterning (SADP) or self-aligned quadruple patterning (SAQP). In some examples, the patterned spacer layer 118 may contain $SiO_2$, SiN, or a combination of $SiO_2$ and SiN.

FIG. 1D illustrates the structure of FIG. 1C following deposition of an organic planarization layer (OPL) 120 that fills the recessed features 125 in the patterned spacer layer 118, an anti-reflection coating (ARC) 122 formed on the OPL 120, and a patterned photoresist layer 124 containing a recessed feature 126 formed on the ARC 122. The ARC 122 may include a SiARC layer that can include Si-containing polymers that are cross-linked and have different Si-contents. Exemplary SiARC layers that are currently used for photolithography may have a silicon-content of 17% Si (SiARC 17%) or a silicon-content of 43% Si (SiARC 43%). According to some embodiments of the invention, the SiARC layer may have a Si-content between about 10% and about 40%, or a Si-content greater than about 40%. The OPL 120 can include a photo-sensitive organic polymer or an etch type organic compound. For instance, the photo-sensitive organic polymer may be polyacrylate resin, epoxy resin, phenol resin, polyamide resin, polyimide resin, unsaturated polyester resin, polyphenylenether resin, polyphenylenesulfide resin, or benzocyclobutene (BCB). These materials may be formed using spin-on techniques. The OPL 120 may be an organic material (e.g., $(CH_x)_n$) that forms a cross-linked structure during a curing process. The patterned photoresist layer 124 may be formed using well known lithography and etching methods.

Figure 1F:
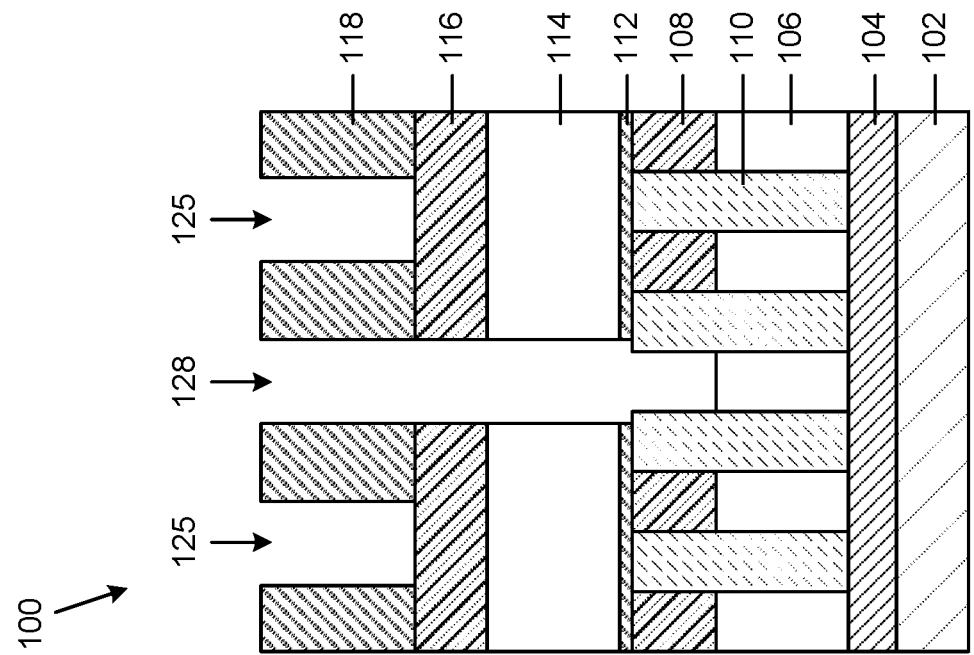
Figure 1E:
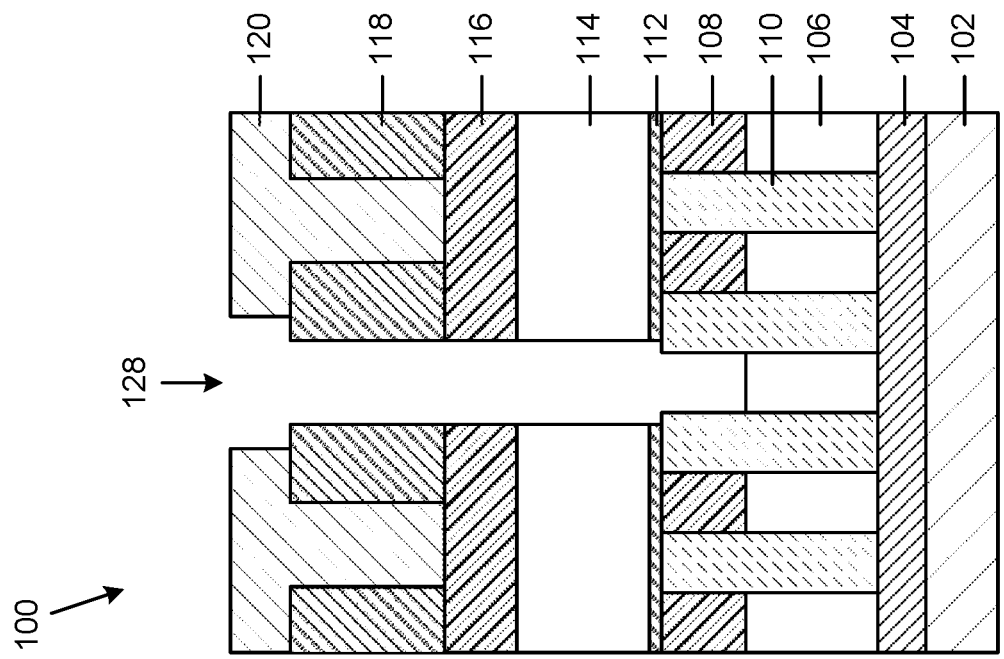

FIG. 1E illustrates the structure of FIG. 1D following a self-aligned via formation etch process that forms a self-aligned via 128, and subsequent removal of the patterned photoresist layer 124 and the ARC 122. The self-aligned via 128 extends through the dielectric hard mask (HM) lines 108 between the ILD features 110, and stops on one of the metal lines 106. In one example, the self-aligned via 128 can have a width of 20-40 nm (approximately the distance between adjacent ILD features 110) and a depth of about 100 nm. Those skilled in the art will readily appreciate that good etch selectivity is needed between the ILD features 110 and the HM lines 108 between the ILD features 110.

FIG. 1F illustrates the structure of FIG. 1E following an ashing process that removes the OPL 120 and opens up the recessed features 125 in the patterned spacer layer 118.

Figure 1H:
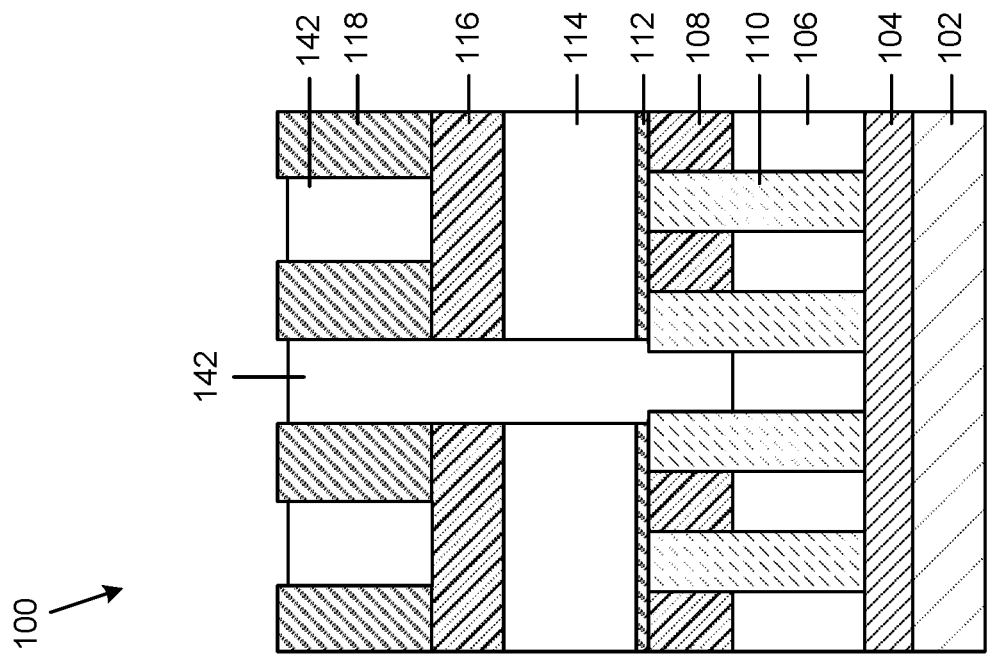
Figure 1G:
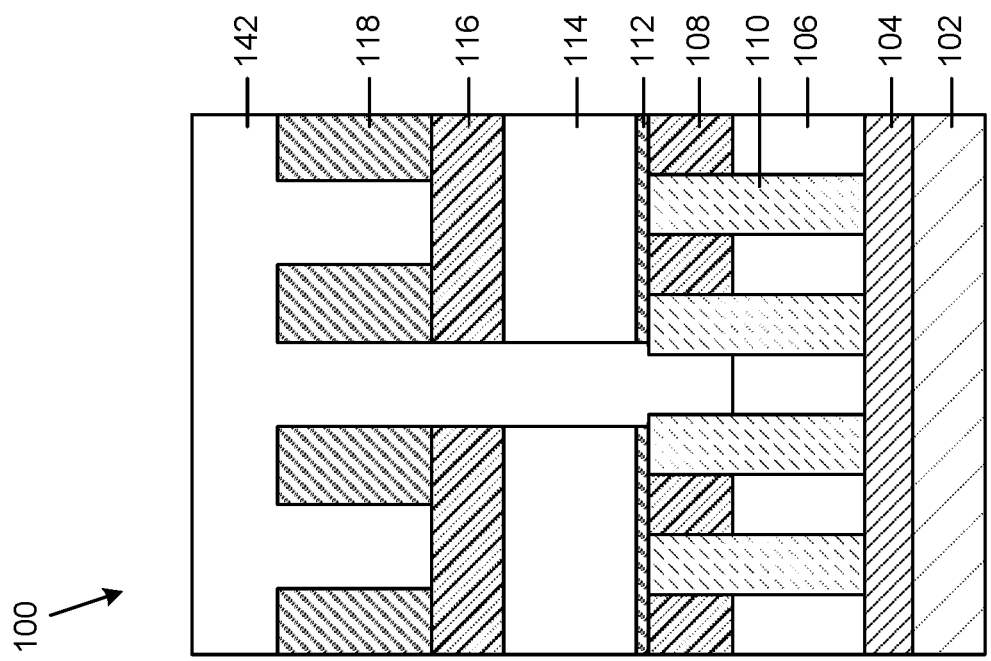

FIG. 1G illustrates the structure of FIG. 1F following deposition of a second metal layer 142 that fills the self-aligned via 128 and the recessed features 125 in the patterned spacer layer 118. Further, the second metal layer 142 is in direct contact with and provides an electrical connection with one of the metal lines 106. According to some embodiments, the second metal layer 142 may contain or consist of Ru metal, Co metal, or Cu metal.

FIG. 1H illustrates the structure of FIG. 1G following an etch back or a chemical mechanical polishing (CMP) process that removes the portion of the second metal layer 142 that is above the patterned spacer layer 118. As depicted in FIG. 1H, the second metal layer 142 may be recessed below the top of the patterned spacer layer 118.

Figure 1J:
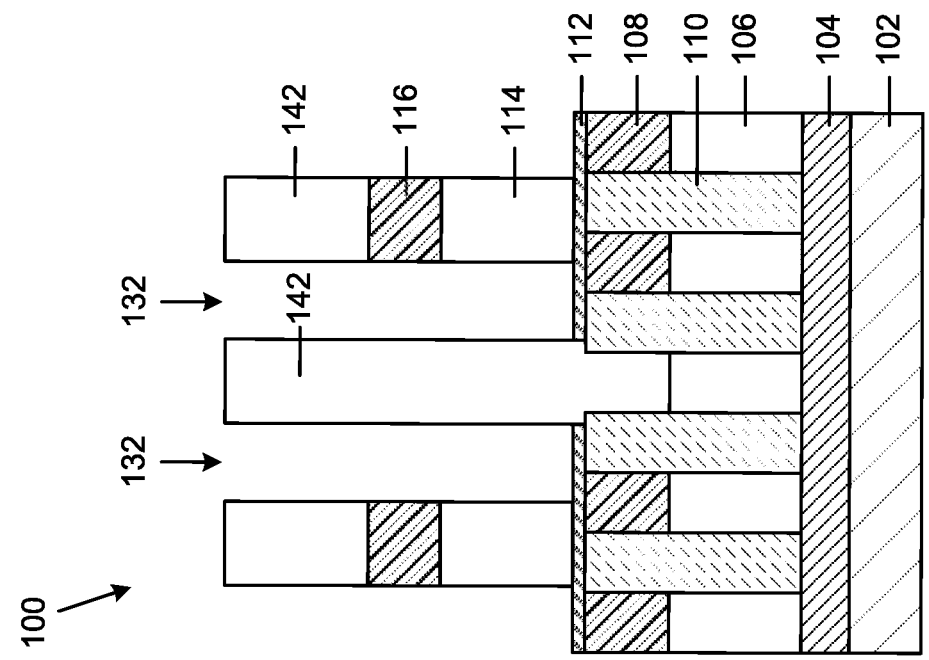
Figure 1I:
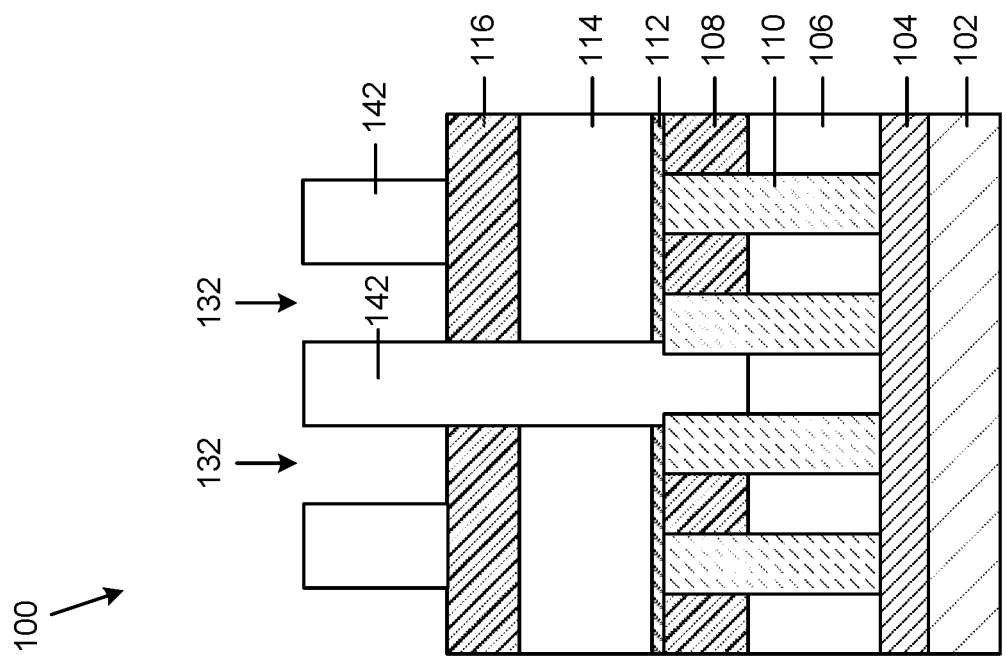

FIG. 1I illustrates the structure of FIG. 1H following an etching process that removes the patterned spacer layer 118, thereby forming a recessed features 132 between adjacent features of the second metal layer 142.

FIG. 1J illustrates the structure of FIG. 1I following an etching process that uses the second metal layer 142 as a metal hard mask to anisotropically etch the dielectric HM layer 116 and the first metal layer 114, thereby extending the recessed features 132 through the first metal layer 114. The etched first metal layer 114 forms fully self-aligned interconnects that, although not shown in FIG. 1J, may also be present in front and behind the second metal layer 142. According to one embodiment, different metals may be used for first metal layer 114 and second metal layer 142 in order to provide high etch selectivity between first metal layer 114 and second metal layer 142. According to another embodiment, the same metal may be used for the first metal layer 114 and second metal layer 142 by optimizing the thickness of the second metal layer 142 relative to the first metal layer 114. For example, increasing the thickness of the second metal layer 142 relative to the first metal layer 114 can enable use of the same metal for first metal layer 114 and second metal layer 142.

According to one embodiment, further processing of the substrate 100 in FIG. 1J is schematically shown in FIGS. 1K-1O.

Figure 1L:
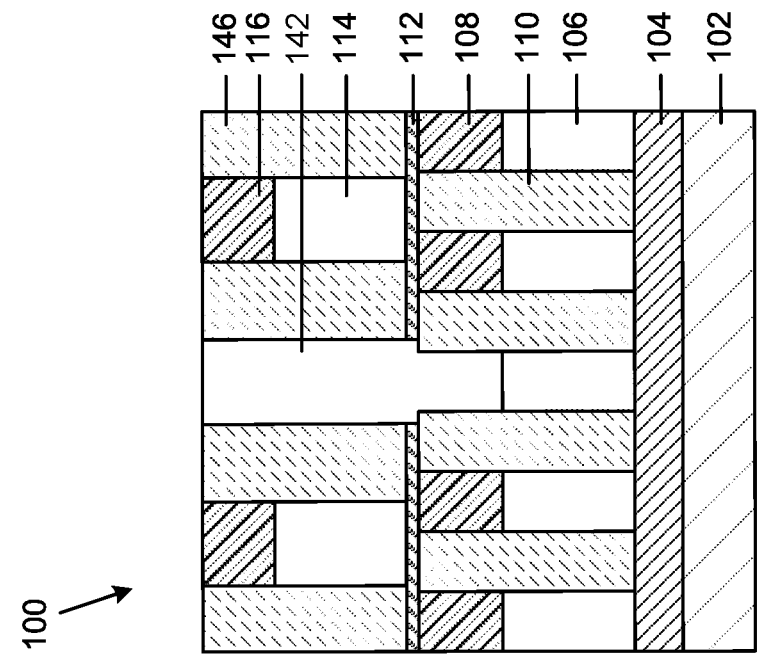
Figure 1K:
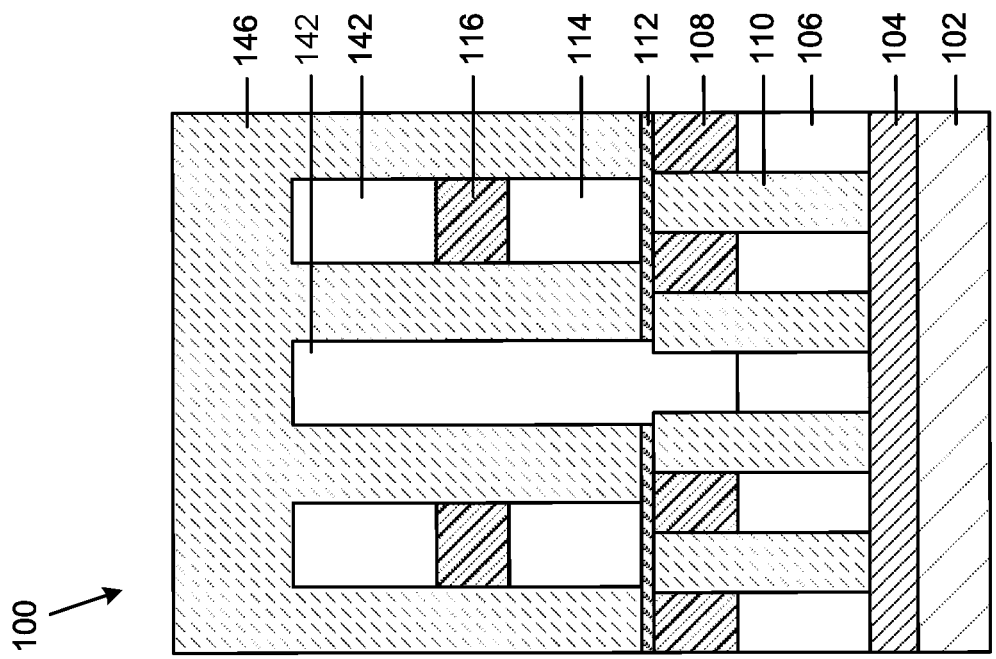

FIG. 1K illustrates the structure of FIG. 1J following deposition of an ILD layer 146 that fills the recessed features 132 and forms an overburden above the patterned second metal layer 142. The ILD layer 146 may, for example, be formed by spin-on deposition.

FIG. 1L illustrates the structure of FIG. 1K following a planarization process (e.g., chemical mechanical planarization (CMP)) that removes the ILD layer 146 and the second metal layer 142 above the dielectric HM layer 116. Since the ILD layer 146 is deposited and planarized following the plasma patterning of the first metal layer 114 and the second metal layer 142, plasma damage of the ILD layer 146 is avoided.

Figure 1N:
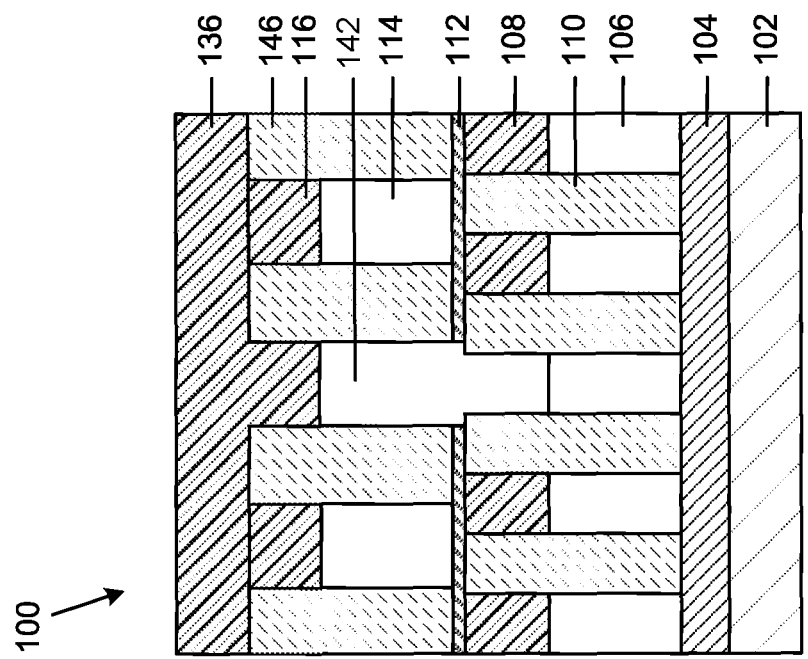
Figure 1M:
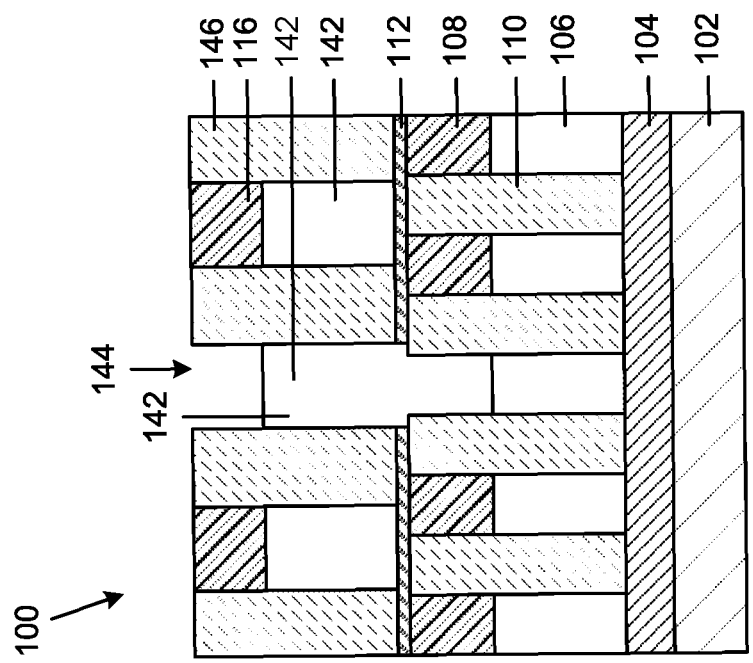

FIG. 1M illustrates the structure of FIG. 1L following an etch back process that recesses the second metal layer 142 and forms a recessed feature 144 between features of the ILD layer 146.

FIG. 1N illustrates the structure of FIG. 1M following deposition of an additional dielectric hard mask (HM) layer 136. In one example, the additional dielectric HM layer 136 and the dielectric HM layer 116 may contain the same material.

FIG. 1O illustrates the structure of FIG. 1N following planarization process (e.g., CMP) that removes the additional dielectric HM layer 136 above the dielectric HM layer 116 and the ILD layer 146.

Figure 2A:
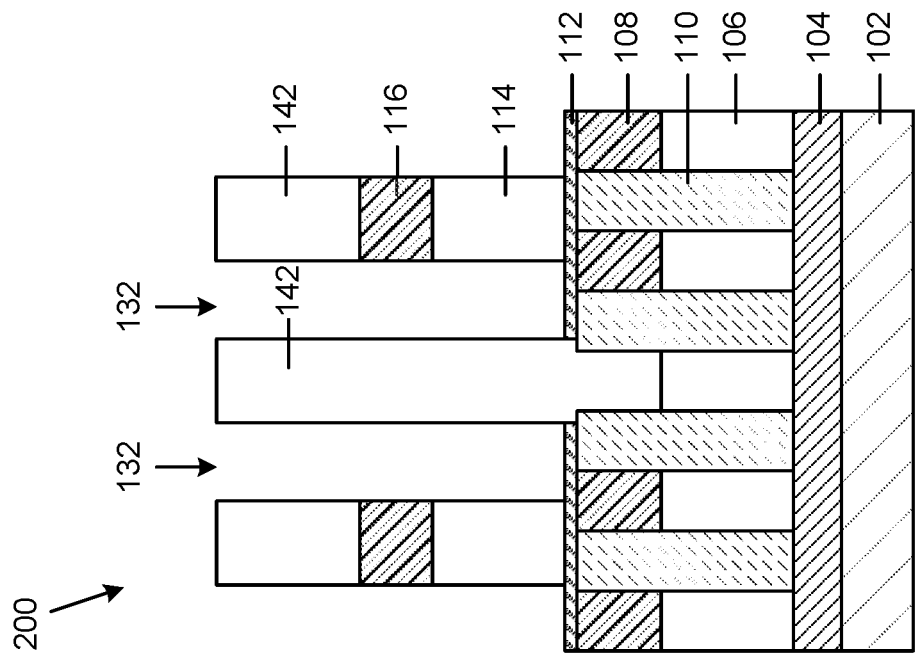
FIGS. 2A-2C illustrate portions of integrated circuit layers representing various operations in accordance with an embodiment of the present invention.
Figure 10:
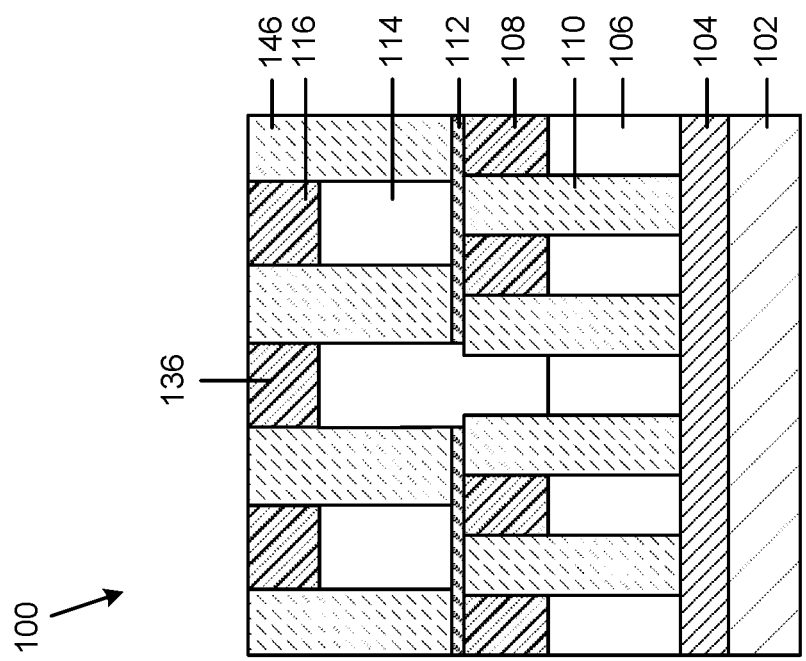
Figure 2C:
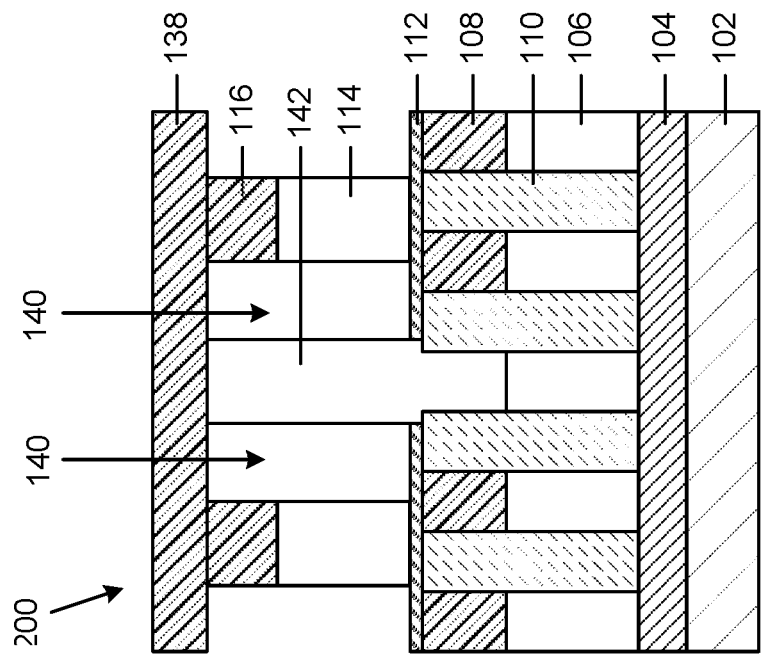
Figure 2B:
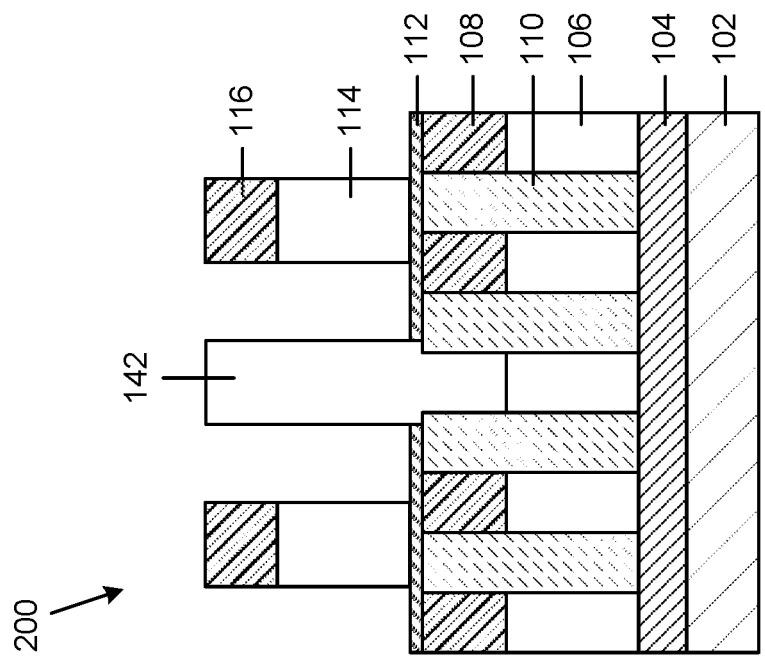

According to another embodiment, further processing of the substrate 100 in FIG. 1J is schematically shown in FIGS. 2A-2C. Substrate 100 of FIG. 1J is reproduced as substrate 200 in FIG. 2A.

FIG. 2B illustrates the structure of FIG. 2A following a removal of the second metal layer 142 above the dielectric HM layer 116.

FIG. 2C illustrates the structure of FIG. 2B following deposition of a cap material 138 that forms an air gap 140 between the first and second metal layers 114, 142 below the cap material 138. The cap material 138 may be non-conformally deposited using vapor phase deposition where the reactants do not enter the voids between the first and second metal layers 114, 142.

Self-aligned interconnect patterning for back-end-of-line (BEOL) structures has been disclosed in various embodiments. The foregoing description of the embodiments of the invention has been presented for the purposes of illustration and description. It is not intended to be exhaustive or to limit the invention to the precise forms disclosed. This description and the claims following include terms that are used for descriptive purposes only and are not to be construed as limiting. Persons skilled in the relevant art can appreciate that many modifications and variations are possible in light of the above teaching. Persons skilled in the art will recognize various equivalent combinations and substitutions for various components shown in the Figures. It is therefore intended that the scope of the invention be limited not by this detailed description, but rather by the claims appended hereto.

What is claimed is:

1. A method of fabricating an interconnect structure for an integrated circuit, the method comprising:
    depositing a first metal layer on an initial interconnect structure;
    forming a patterned spacer layer containing recessed features on the first metal layer;
    etching a self-aligned via in the first metal layer and into the initial interconnect structure using a recessed feature in the patterned spacer layer as a mask;
    filling the via in the first metal layer and the recessed features in the patterned spacer layer with a second metal layer;
    removing the patterned spacer layer; and
    etching a recessed feature in the first metal layer using the second metal layer as a mask.

2. The method of claim 1, further comprising:
    depositing an inter layer dielectric layer that fills the recessed feature in the first metal layer.

3. The method of claim 2, further comprising:
    removing the inter layer dielectric layer and the second metal layer above the dielectric hard mask layer.

4. The method of claim 3, further comprising:
    recessing the second metal layer to below the top of the inter layer dielectric.

5. The method of claim 4, further comprising
    depositing an additional dielectric hard mask layer that fills the recessed feature on top of the second metal layer.

6. The method of claim 5, further comprising:
    removing the additional dielectric hard mask layer above the top of the inter layer dielectric layer.

7. The method of claim 1, wherein depositing the first metal layer includes
    depositing an etch stop layer (ESL) on the initial interconnect structure, depositing the first metal layer on the etch stop layer, and depositing a dielectric hard mask on the first metal layer.

8. The method of claim 7, wherein the patterned spacer layer is formed on the dielectric hard mask.

9. The method of claim 1, further comprising:
    removing the second metal layer above the dielectric hard mask layer.

10. The method of claim 9, further comprising:
    depositing a cap material that forms an air gap between the first and second metal layers below the cap material.

11. The method of claim 1, wherein the initial interconnect structure includes inter layer dielectric features, and metal lines and dielectric hard mask lines between the inter layer dielectric features, wherein the dielectric hard mask lines are positioned on top of the metal lines.

12. The method of claim 1, further comprising:
    depositing an organic planarization layer (OPL) that fills the recessed features in the patterned spacer layer;
    depositing an anti-reflection coating (ARC) on the OPL; and
    forming a patterned photoresist layer on the ARC.

13. The method of claim 1, further comprising
    following the etching of the self-aligned via in the first metal layer, removing the OPL from the recessed features in the patterned spacer layer.

14. The method of claim 1, further comprising:
    removing the portion of the second metal layer that is above the patterned spacer layer.

15. A method of fabricating an interconnect structure for an integrated circuit, the method comprising:
    depositing an etch stop layer (ESL) on the initial interconnect structure, depositing a first metal layer on the etch stop layer, and depositing a dielectric hard mask on the first metal layer;
    forming a patterned spacer layer containing recessed features on the dielectric hard mask;

etching a self-aligned via in the first metal layer and into the initial interconnect structure using a recessed feature in the patterned spacer layer as a mask;

filling the via in the first metal layer and the recessed features in the patterned spacer layer with a second metal layer;

removing the patterned spacer layer;

etching a recessed feature in the first metal layer using the second metal layer as a mask; and depositing an inter layer dielectric layer that fills the recessed feature in the first metal layer.

16. The method of claim 15, further comprising depositing an organic planarization layer (OPL) that fills the recessed features in the patterned spacer layer;

depositing an anti-reflection coating (ARC) on the OPL; and forming a patterned photoresist layer on the ARC.

17. The method of claim 15, further comprising following etching the self-aligned via in the first metal layer, removing the OPL from the recessed features in the patterned spacer layer.

18. The method of claim 15, further comprising:

removing the portion of the second metal layer that is above the patterned spacer layer.

19. The method of claim 15, wherein the initial interconnect structure includes inter layer dielectric features, and metal lines and dielectric hard mask lines between the inter layer dielectric features, wherein the dielectric hard mask lines are positioned on top of the metal lines.

20. A method of fabricating an interconnect structure for an integrated circuit, the method comprising:

depositing an etch stop layer (ESL) on the initial interconnect structure, depositing a first metal layer on the etch stop layer, and depositing a dielectric hard mask on the first metal layer;

forming a patterned spacer layer containing recessed features on the dielectric hard mask;

depositing an organic planarization layer (OPL) that fills the recessed features in the patterned spacer layer;

depositing an anti-reflection coating (ARC) on the OPL;

forming a patterned photoresist layer on the ARC;

etching a self-aligned via in the first metal layer and into the initial interconnect structure using a recessed feature in the patterned spacer layer as a mask;

removing the OPL from the recessed features in the patterned spacer layer;

filling the via in the first metal layer and the recessed features in the patterned spacer layer with a second metal layer;

removing the portion of the second metal layer that is above the patterned spacer layer;

removing the patterned spacer layer;

etching a recessed feature in the first metal layer using the second metal layer as a mask; and depositing an inter layer dielectric layer that fills the recessed feature in the first metal layer.

* * * * *